(12) United States Patent
Hineman et al.

(10) Patent No.: US 6,384,001 B2
(45) Date of Patent: *May 7, 2002

(54) DILUTE CLEANING COMPOSITION

(75) Inventors: Max Hineman; Guy T. Blalock, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/808,014

(22) Filed: Mar. 3, 1997

(51) Int. Cl.$^7$ .......................... C09K 13/06; C11D 7/08
(52) U.S. Cl. ..................... 510/175; 510/254; 510/269; 510/405; 510/467; 134/2; 134/3; 252/79.2
(58) Field of Search .................. 510/175, 176, 510/254, 255, 269, 405, 467, 488, 238, 434; 134/3, 41, 2, 28; 252/79.2, 79.4

(56) References Cited

U.S. PATENT DOCUMENTS

| | | | |
|---|---|---|---|
| 4,145,451 A | * 3/1979 | Oles | 426/321 |
| 4,230,522 A | 10/1980 | Martin et al. | |
| 4,256,250 A | * 3/1981 | Koike et al. | 148/171 |
| 4,339,340 A | * 7/1982 | Muraoka et al. | 252/79.5 |
| 4,415,606 A | * 11/1983 | Cynkar et al. | 427/90 |
| 4,642,168 A | 2/1987 | Imai | 204/129.65 |
| 4,895,617 A | 1/1990 | Roche et al. | 156/665 |
| 5,258,093 A | 11/1993 | Maniar | 156/626 |
| 5,376,235 A | 12/1994 | Langley | 156/664 |
| 5,508,229 A | 4/1996 | Baker | |
| 5,560,857 A | * 10/1996 | Sakon et al. | 510/175 |
| 5,689,334 A | 11/1997 | Atkinson et al. | |
| 5,939,336 A | 8/1999 | Yates | |
| 6,012,469 A | 1/2000 | Li et al. | |

FOREIGN PATENT DOCUMENTS

| | | | | |
|---|---|---|---|---|
| EP | 649168 | * | 4/1995 | |
| EP | 784336 | * | 7/1997 | |
| EP | 789071 | * | 8/1997 | |
| JP | 5037372 | * | 4/1975 | ........... H01L/21/30 |
| JP | 50-37372 | | 12/1977 | |
| JP | 82-016488 | | 4/1982 | |
| JP | 62-125633 | | 6/1987 | |
| JP | 62-211391 | | 9/1987 | |
| JP | 63-133535 | | 6/1988 | |
| JP | 61-22982 | | 5/1994 | |
| JP | 8048996 | * | 2/1996 | |
| WO | 97/05228 | * | 2/1997 | |
| WO | 97/18582 | * | 5/1997 | |

OTHER PUBLICATIONS

Molt, K., et al., "Analysis of aqueous solutions by near–infrared spectrometry", Journal of Molecular Structure, vol. 410–411, pp. 565–572, Jun. 1997.*

Viktorova, E.N., et al., "Aqueous solution of phosphoric acid as the stationary phase for selective separation of fatty accids under conditions of steam chromatography", Russ. Chem. Bull., 46(3), 476–478, Month not known 1997.*

Ghilarducci, A., et al., "The Bordoni relaxation in high purity copper single crystals at low frequencies", Journal de Physique IV, 6(8), 211–214, Dec. 1996.*

(List continued on next page.)

*Primary Examiner*—Yogendra N. Gupta
*Assistant Examiner*—Gregory E. Webb
(74) *Attorney, Agent, or Firm*—Mueting, Raasch & Gebhardt, P.A.

(57) ABSTRACT

A dilute composition for use in semiconductor processing includes both phosphoric acid and acetic acid. Each of the acidic components may be at a concentration of less than about 10% by volume of the dilute composition. The dilute composition can be used for cleaning various surfaces, such as, for example, patterned metal layers and vias by exposing the surfaces to the dilute composition.

5 Claims, 6 Drawing Sheets

OTHER PUBLICATIONS

Banas, J., "Passivity of metals in anhydrous solutions of oxy-acids", Materials Science Forum, vol. 185-188, pp. 845-852, Month not known 1995.*

Singh, V.B., et al., "Active, passive and transpassive dissolution of a nickel base super alloy in concentrated acid mixture solution", Materials and Corrosion, 46(10), 590-594, Oct. 1996.*

Sastri, V.S., et al., "Studies on the determination of surface deuterium in AISI 1062, 4037, and 4140 steels by secondary ion mass spectrometry", Metallurgical Transactions A, 19A(12), 3071-3075, Dec. 1988.*

Pons Muzzo, Gaston, "Numerical and graphical observations of the volume reduction of aqueous solutions", Bol. Soc. Quim. Peru, 42(4), 179-191, Month not known 1976.*

Dingley, W., et al., "An improved bismuth plating process", Plating and Surface Finishing, 63(4), 26-33, Apr. 1976.*

Metallographic Etching, Gunter Petzow, American Society for Metals, 1976, Gebruder Borntraeger, Berlin; pp 37, 96.*

* cited by examiner

DILUTE CLEANING COMPOSITION

FIELD OF THE INVENTION

The present invention relates to the fabrication of semiconductor integrated circuits, and in particular, to cleaning compositions and methods for cleaning surfaces during fabrication.

BACKGROUND OF THE INVENTION

In the fabrication of semiconductor integrated circuits (ICs), active device regions are formed in semiconductor substrates, isolated from adjacent devices with an isolating material. Electrical paths connect such active devices, using thin-film structures, such as metal lines/patterned metal layers. Such structures make contact with active devices through openings, or contact holes, in the isolating material. One primary concern in forming such interconnects is the maintenance of a low level of resistivity throughout an IC in order to ensure devices perform properly. As ICs are scaled down in size, so are the devices which make up the ICs. Increases in resistance are associated with increasing circuit density and adversely affect device performance, slowing them down and increasing power consumption. Thus, ways to decrease the overall resistance of ICs are crucial to continued successful device performance.

In many applications, the metal lines/patterned metal layers are formed on a different level than the active devices, separated by an insulating layer, such as, for example, silicon dioxide or borophosphosilicate glass (BPSG). Furthermore, there may be more than one level of metal lines/patterned metal layers, connected by conductive interconnects formed in vias defined in an insulating layer between adjacent metal lines/patterned metal layers. Commonly used metal lines/patterned metal layers include aluminum, to which copper may be added to form an alloy. Interconnects are also formed between individual devices and the metal lines/patterned metal layers. A typical interconnect to an active device region is formed in a contact hole defined in an insulating layer over the active device region. The contact hole is filled with one or more metals, such as, for example, aluminum or tungsten.

In lowering resistivity of an IC, it is important to remove all foreign residue from interfaces in the IC. As multiple layers are formed in ICs, individual layers may need to be cleaned before the next layer is formed or before surface modification is done. Numerous preclean procedures exist for use prior to semiconductor surface modification in batch furnaces, including wet chemical cleans, hydrogen bakes, phosphoric acid, and hydrofluoric acid (HF) vapor cleans. Many cleaning compositions undesirably contain strong, i.e., not dilute, organic solvents, which typically are disposed of using special hazardous waste disposal techniques.

Preclean procedures are important to both reduce native oxide and remove other contaminants, such as, for example, residual organic and metallic impurities. Residual photoresist and other organic materials used in processing steps, such as, for example, etches, are often hard to remove from surfaces during IC fabrication. In particular, such residual materials are hard to remove from metal surfaces and surfaces adjacent to metal layers due to the metallization of such organic residue on the surfaces, particularly as a result of intermixing of materials during etch steps. Thus, metal layers and vias have been hard to effectively clean in the past after completion of patterning etches and via etches through insulating layers thereon. Further, conventional cleaning compositions used are typically hazardous and require special handling and disposal procedures.

Therefore, for the reasons as described above, there is a need for effective cleaning compositions and methods of cleaning surfaces during fabrication of ICs. For example, a composition and method for cleaning metal surfaces during fabrication is needed to remove metallized organic residue from surfaces during IC fabrication in order to lower the resistivity of resulting ICs. Further, it is desirable that the cleaning compositions utilized can be disposed of safely and easily.

SUMMARY OF THE INVENTION

A cleaning composition in accordance with the present invention for use in semiconductor integrated circuit fabrication includes an aqueous solution including phosphoric acid at a concentration of less than about 10% by volume and acetic acid at a concentration of less than about 10% by volume. In one embodiment of the cleaning composition, the phosphoric acid is of a concentration of about 5% by volume or less and the acetic acid is of a concentration of about 5% by volume or less. In another embodiment of the cleaning composition, the cleaning composition is heated to less than about 50 degrees Celsius. In a further embodiment of the cleaning composition, the cleaning composition is heated to a temperature of about 30 to about 45 degrees Celsius.

DESCRIPTION OF THE EMBODIMENTS

Figure 1A:
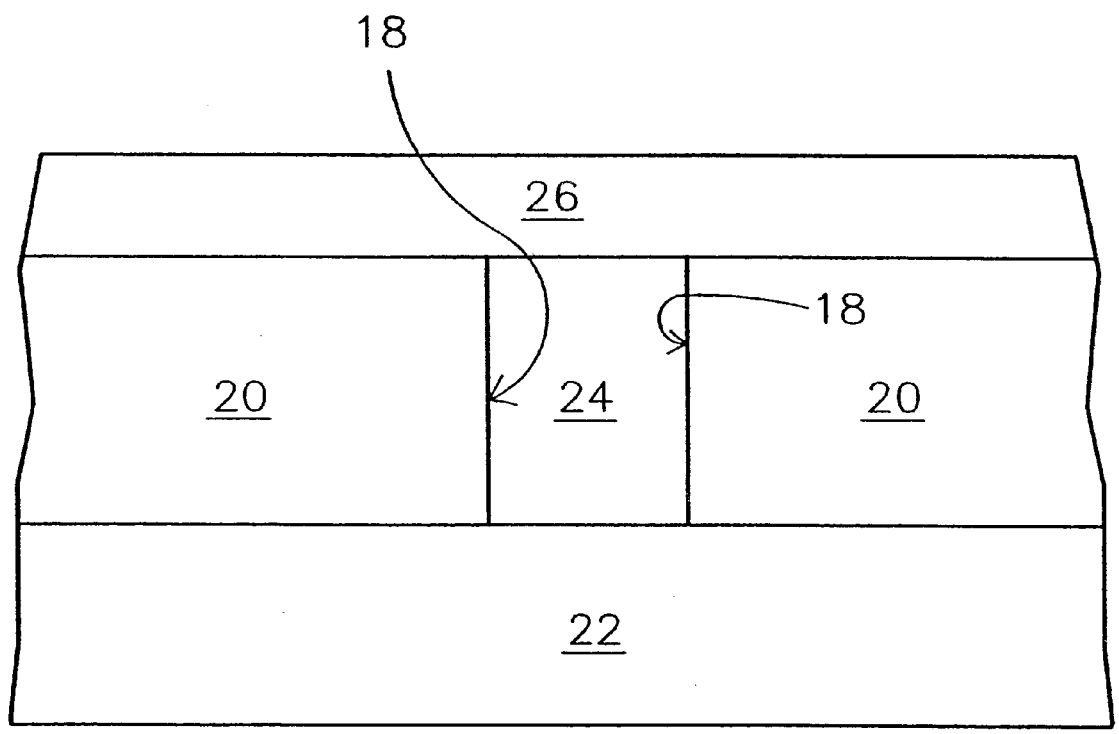
FIGS. 1A to 1K are cross-sectional representations of a multilevel interconnect structure formed using a cleaning composition including phosphoric acid and acetic acid in accordance with the present invention, and intermediate structures thereof.

In the following detailed description, reference is made to the accompanying Figures which form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention as defined in the accompanying claims. For example, the terms wafer and substrate used herein include any semiconductor-based structure. Both are to be understood as including silicon-on-sapphire (SOS) technology, silicon-on-insulator (SOI) technology, doped and undoped semiconductors, epitaxial layers of silicon supported by a base semiconductor, as well as other semiconductor-based structures well known to one skilled in the art. Furthermore, when reference is made to a wafer or substrate in the following description, previous process steps may have been utilized to form regions/junctions in the semiconductor-based structure previously formed. The following detailed description is, therefore, not to be taken in a limiting sense, and the scope of the present invention is defined by the appended claims.

Generally, a chemical composition in accordance with the present invention for use in wet cleans in semiconductor processing includes both phosphoric acid and acetic acid. The chemical composition is dilute and is used at slightly elevated temperatures. Dilute refers to a composition having about 20% reactive components or less by volume. This chemical composition provides better solvation of metallized polymers and organic polymers than previously used cleaning compositions, such as standard phosphoric acid cleans. However, the dilute nature of the chemical composition prevents removal of too much material from the surface being cleaned. The chemical composition is advantageous as compared with previously used strong (i.e., not dilute) organic solvent cleans because it does not require special hazardous waste disposal. Acetic acid is a mild organic reactant and the concentration at which it is used is very safe. The use of both acidic components together in the cleaning composition is beneficial. The phosphoric acid component promotes solvation of inorganic residue, while the acetic acid component promotes salvation of organic residue.

The concentration of phosphoric acid in the chemical composition of the invention is about 10% by volume or less. The concentration of acetic acid is also about 10% by volume or less. If the concentrations of these two acidic components is increased, excess metal loss may result from the surface being cleaned. These reactive components are diluted in deionized water or any suitable solvent. The concentration of each of the two acidic components can be less than about 5% by volume. The concentration of the two acidic components need only be enough to accomplish effective removal of residue on a surface, particularly metallized organic residue. One illustrative example of such a chemical composition includes about 5% phosphoric acid, about 5% acetic acid, and about 90% deionized water.

Other additives, such as surfactants, passivation agents, and oxidation agents (e.g., nitric acid) may be added to the cleaning composition to help tailor it for a particular application. For example, passivation agents, such as ethylene glycol or triethanolamine, may be added to the composition to aid in passivating the metal surface so as to reduce the amount of metal loss during the cleaning step.

The chemical composition is heated above ambient temperature in a circulating bath prior to its use. The chemical composition is heated to about 50 degrees Celsius or less. If higher temperatures are used, the integrity of underlying metallic layers is possibly degraded. Temperatures of about 30 to about 45 degrees Celsius are ideal for optimizing the cleaning abilities without severe metal loss from underlying layers when the concentrations of each of the two acidic components are present in the composition in amounts of about 10% or less, and even more preferable when concentrations of each of the two acidic components are present in the composition in amounts of about 5% or less. When lower concentrations of each of the two acidic components are present in the composition, higher temperatures may be effectively used without severe metal loss from underlying layers. Similarly, when higher concentrations of each of the two acidic components are present in the composition, lower temperatures may need to be used to avoid severe metal loss from underlying layers.

The chemical composition of the present invention is typically used for cleans performed in the fabrication of an interconnect structure. For example, the present invention is useful for cleans performed in fabricating a multilevel interconnect structure. Interconnect structure, as used herein, refers to vias, contacts, metal lines/patterned layers, pads, and similar conductive circuitry utilized in an integrated circuit. FIGS. 1A to 1K illustrate a multilevel interconnect structure and intermediate structures thereof. Dimensions and scaling in the Figures are not exact, but represent the nature of fabricating a multilevel interconnect structure in general and the necessity for utilizing the chemical composition of the present invention for cleaning intermediate structures thereof.

In the fabrication of a multilevel interconnect structure, a contact hole 18 is typically defined in an insulating layer 20, such as, for example, borophosphosilicate glass (BPSG), as illustrated in FIG. 1A. The contact hole 18 is defined over an active area of an underlying substrate, as represented generally by 22. An interconnect structure 24 is then formed in the contact hole 18 using any suitable materials and methods for forming the same. Typical interconnect 24 fabrication includes formation of a series of layers, such as, for example, titanium silicide, titanium nitride, and a metal plug or other conducting layers. Next, a blanket layer of metal 26 is deposited over the interconnect structure 24 and insulating layer 20, to produce the structure illustrated in FIG. 1A. The metal layer 26 can be any conductive material, such as, for example, aluminum or aluminum alloyed with copper. Other elements that can constitute the conductive material include titanium and silicon.

Figure 1B:
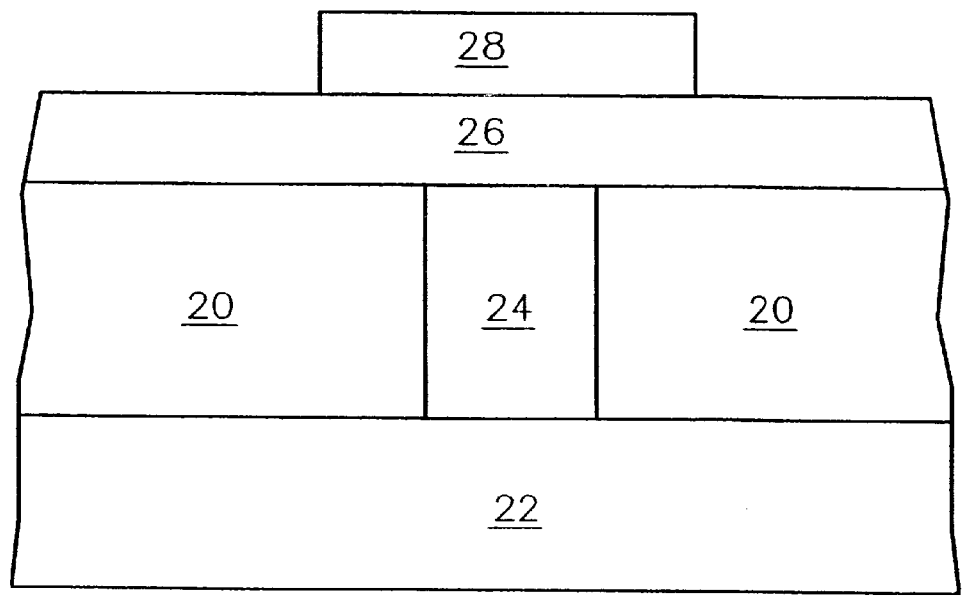

A photoresist layer 28 is then deposited on the metal layer 26 and patterned as well known to one skilled in the art, resulting in the structure illustrated in FIG. 1B. The metal layer 26 is then etched in exposed areas, resulting in the metal line structure illustrated in FIG. 1C.

The etchant used to pattern the metal layer 26 varies. For patterning aluminum, chlorine-containing etchants are typically used, i.e., for example, $Cl_2$, $BCl_3$, $CCl_4$, $SiCl_4$ and combinations thereof. However, the exact nature of the etchant is not critical to the scope of the invention.

Residue 29, such as organic residue of etch-related polymers, often remains on the exposed metal 26 surface. Depending on the constituent elements of the exposed metal surface 26, the etchant, and the etch-related polymers, the chemical nature of the residue 29 varies. For example, titanium, aluminum, copper, and silicon are common elements utilized in semiconductor fabrication. Carbon, chlorine, and fluorine are common elements utilized in etchants. Carbon, nitrogen, and hydrogen are common elements utilized in etch-related polymers. These elements, or combinations thereof, are typically found in residue 29 on such surfaces 26. Furthermore, oxygen may be present in the residue 29 as a result of the etch-related polymer stripping, for example, when using an oxygen ash for removal of photoresist. In particular, when the etchant contains chlorine, the organic residue often includes aluminum chloride or copper chloride, for example, when the exposed metal 26 surface is aluminum or aluminum alloyed with copper.

Figure 1C:
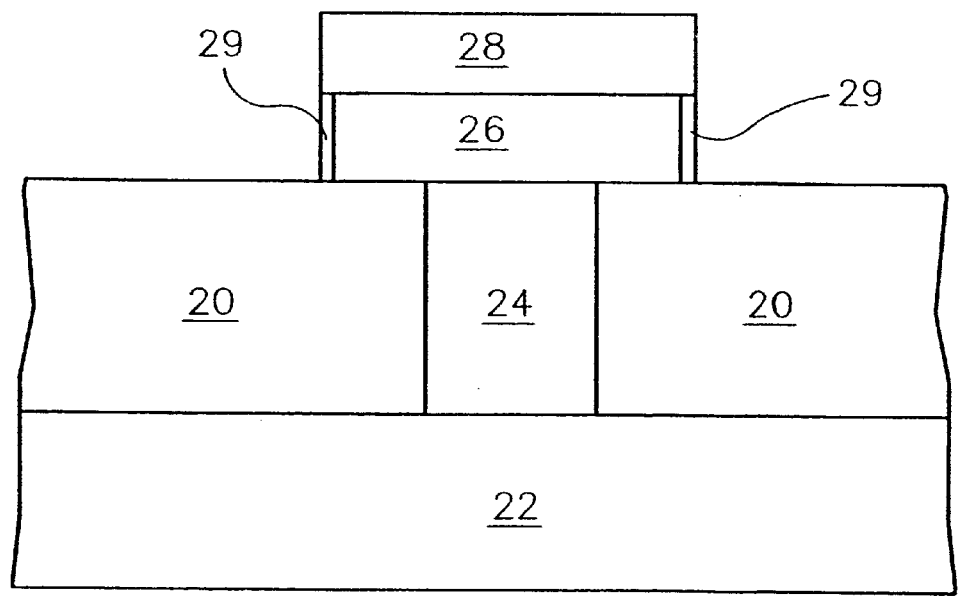

In order to prepare the surface of the structure illustrated in FIG. 1C for insulating layer deposition, the photoresist layer 28 is next removed. To remove the photoresist layer 28 and/or other etch-related polymers after patterning the first metal layer 26, an oxygen ash is commonly used, or any suitable method (wet or dry), as well known to one skilled in the art. For example, a typical oxygen ash includes heating the structure in a furnace having a temperature of about 200 to 300 degrees Celsius and in the presence of an oxygen-containing plasma. Other examples include heating the structure in the presence of an ozone-containing environment or wet cleaning the structure using organic strippers.

Figure 1D:
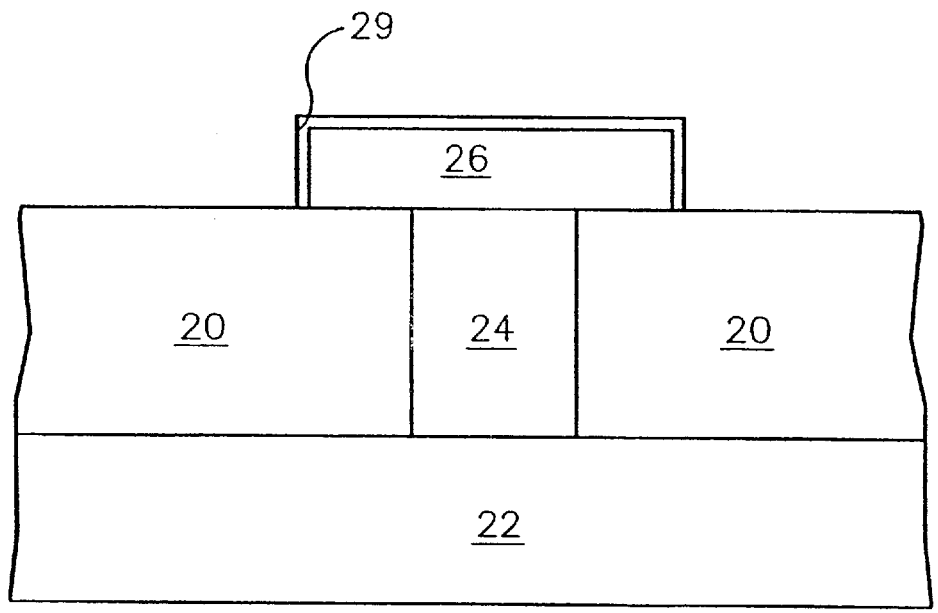

Even after the oxygen ash step, residue 29, such as organic components from the photoresist 28 often remain on the first metal layer 26, as illustrated in FIG. 1D. If not removed, such residue 29 increases the resistivity of the interconnect structure, degrading electrical performance. The longer the first metal layer 26 is exposed to the photoresist 28 during the etch process, the harder it becomes to effectively remove all of the residue 29, such as organic residue, from the surface of the first metal layer 26. This is due to the fact that the organic materials become metallized, as previously mentioned. Thus, the structure illustrated in FIG. 1D is exposed to the cleaning composition of this invention after the oxygen ash step. The exposure time needed for effectively cleaning the metallized organic residue 29 varies. The exposure time is adjusted to allow for adequate cleaning without removing excess metal from underlying surfaces. As one example, an exposure time of about one minute seems to provide an adequate balance between these two competing factors, such as, for example, when using concentrations of each acidic component of less than about 5% by volume and temperatures of about 30 to about 45 degrees Celsius. The cleaning composition of this invention is more effective than conventionally used standard phosphoric acid compositions at removing such residue 29, including any metallized organic elements, due to the acetic acid component.

Figure 1E:
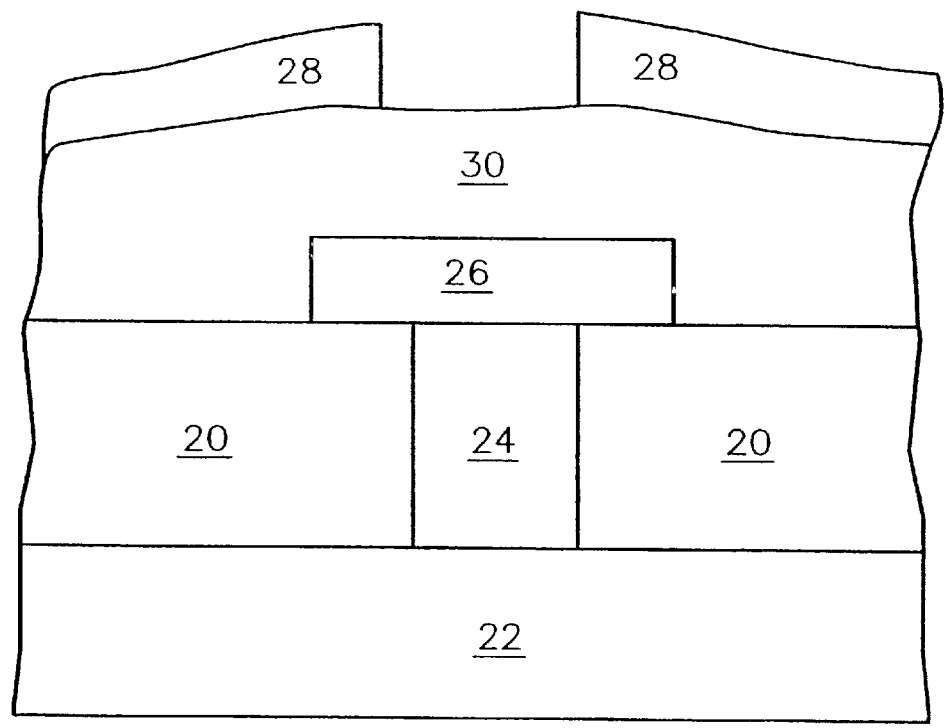

After the first metal layer 26 is patterned and cleaned with the chemical composition of this invention, an insulating layer 30 is formed over the first metal layer 26, as illustrated in FIG. 1E. The insulating layer 30 can be any dielectric material, such as, for example, silicon dioxide, spin-on-glass, or borophosphosilicate glass. Typically, the insulating layer 30 has a low dielectric constant and is formed at relatively low temperatures. Silicon dioxide may be used for the insulating layer 30. The silicon dioxide 30 is formed using any well known technique, such as, for example, tetraethyloxysilicate (TEOS)-based plasma-enhanced chemical vapor deposition (PECVD). The thickness of the insulating layer 30 is determined according to the feature sizes of the integrated circuit as well known to one skilled in the art.

Figure 1F:
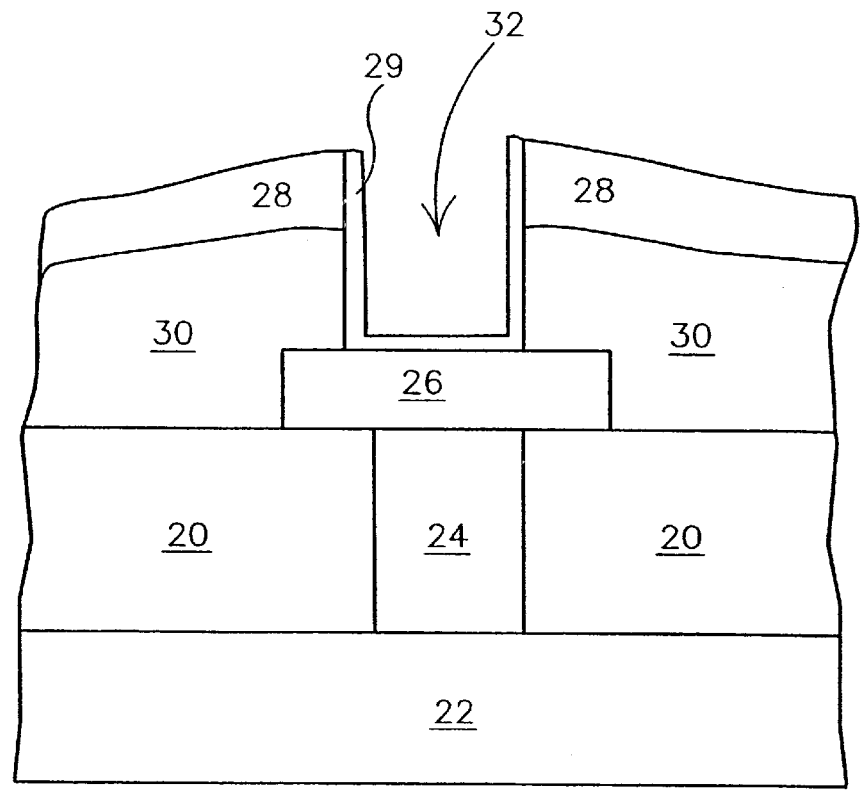

To define a via in the insulating layer 30, a photoresist layer 28 is patterned over the insulating layer 30, as illustrated in FIG. 1E. The via 32 is then defined in the exposed portions of the insulating layer 30 by etching away the exposed insulating layer 30, the resulting structure of which is illustrated in FIG. 1F. The etchant used to define the via 32 varies. Typical etches often comprise more than one step. For example, to define a via 32, a wet etch at standard temperature may be followed by a dry etch (i.e., plasma etch), two adjacent dry etches may be used instead, or a single dry etch may also be used.

For etching silicon dioxide, plasma etchants often contain a fluorine component. Typical etchants include, but are not limited to, $CF_4$, $C_2F_6$, $C_3F_8$, $CHF_3$, $NF_3$, $SF_6$ and combinations thereof. Once again, residue 29, such as organic residue of etch-related polymers, often remains on the exposed metal 26 surface. As previously described, however, the chemical nature of such residue 29 varies depending on the constituent elements of the exposed metal surface 26, the etchant, and the etch-related polymers. In particular, when the etchant contains fluorine, the residue 29 often includes metal fluorides, such as, for example, aluminum fluoride, if the exposed metal 26 is aluminum.

Figure 1G:
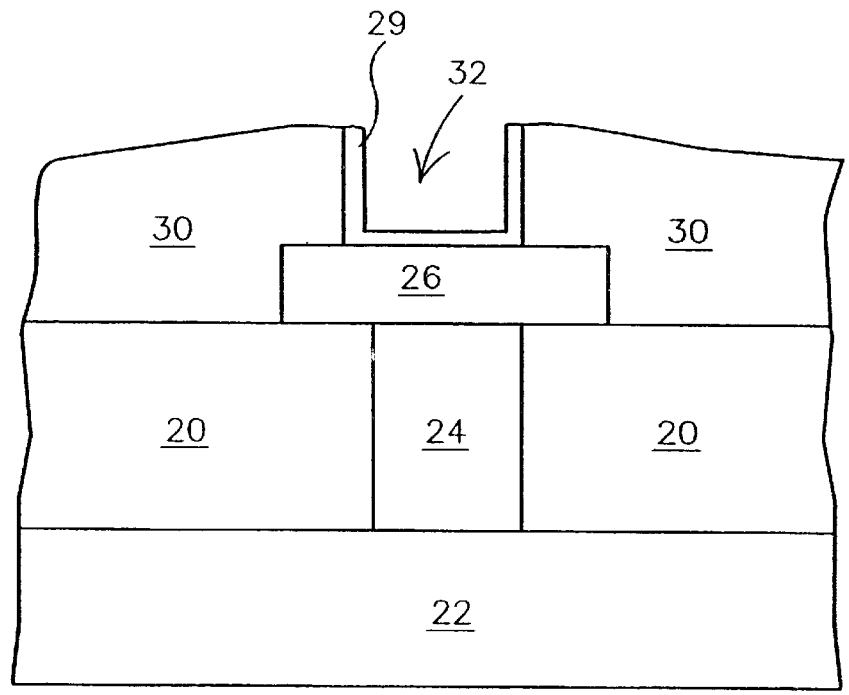

In order to prepare the surface for the next metal layer deposition, the photoresist layer 28 is removed, resulting in the structure illustrated in FIG. 1G. To remove the photoresist layer 28 and/or etch-related polymers after defining the via 32, an oxygen ash, or any suitable method, is commonly used, as described previously.

After the oxygen ash step, residue 29, such as organic components from the photoresist 28 often remain on the first metal layer 26 at the bottom of the via and on the sidewalls of the via 32 at the insulating layer 30 interface. The longer the first metal layer 26 is exposed at the bottom of the via 32, the harder it becomes to effectively remove all of the residue 29 at the bottom of the via 32. This is due to the fact that the organic materials become metallized, as previously described. Thus, the structure illustrated in FIG. 1G is exposed to the cleaning composition of this invention after the oxygen ash step.

The exposure time needed for effectively cleaning the metallized organic residue 29 varies. The exposure time must be adjusted to allow for adequate cleaning without removing excess metal from underlying surfaces. As one example, an exposure time of about one minute seems to provide an adequate balance between these two competing factors.

The cleaning composition of this invention is more effective than conventionally used phosphoric acid compositions at removing such residue 29. However, while piranha cleans (i.e. mixtures of hydrogen peroxide and sulfuric acid) are used for cleaning contact holes, they cannot be used for cleaning vias 32 and metallic surfaces 26, due to their extreme reactivity. The extreme reactivity of such conventional cleans results in severe metal loss from exposed metal surfaces.

Figure 1H:
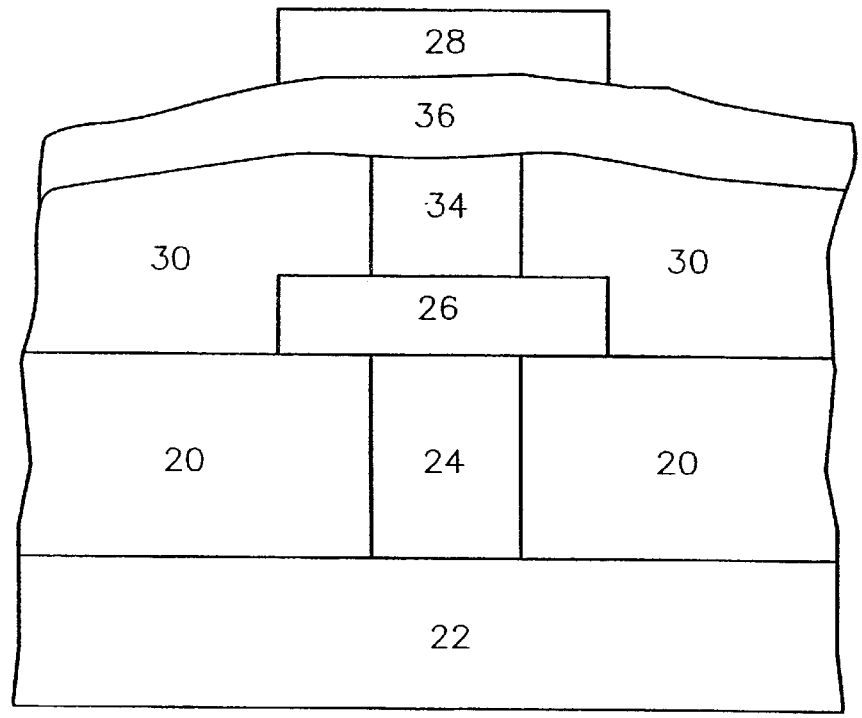
Figure 1I:
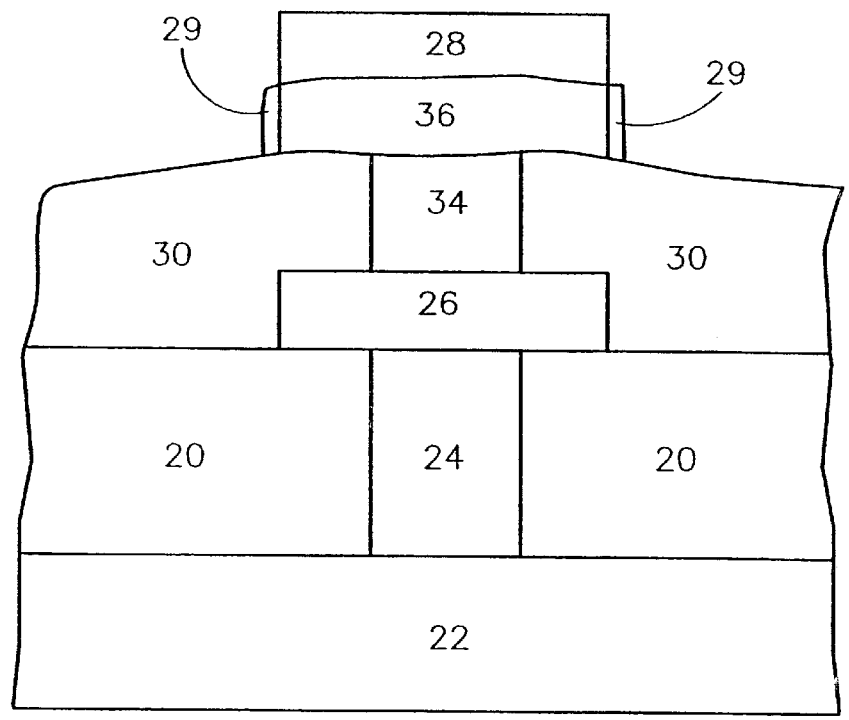

Next, as illustrated in FIG. 1H, an interconnect structure 34 is formed in the via 32 and a second metal layer 36 is formed over the insulating layer 30 and structure 34. The second metal layer 36, like the first metal layer 26 and any subsequent metal layers, can be any conductive material, such as, for example, aluminum or aluminum alloyed with copper. Furthermore, the conductive material constituents can include titanium and/or silicon. The second metal layer 36 is then patterned as well known to one skilled in the art. A patterned photoresist layer 28 is formed over the second metal layer 36, as illustrated in FIG. 1H. The second metal layer 36 is then etched in exposed areas, the resulting structure of which is illustrated in FIG. 1I. The resulting structure often undesirably contains residue 29, such as organic residue, on the exposed surfaces of the second metal layer 36. The etchant used to pattern the second metal layer 36 varies, as described previously, contributing to the presence of the residue 29 on the metal surfaces.

In order to prepare the surface of the structure illustrated in FIG. 1I for deposition of subsequent layers, the photoresist layer 28 is next removed. To remove the photoresist layer 28 and/or etch-related polymers after patterning the second metal layer 36, an oxygen ash, or any suitable method, is commonly used, as described previously.

Figure 1J:
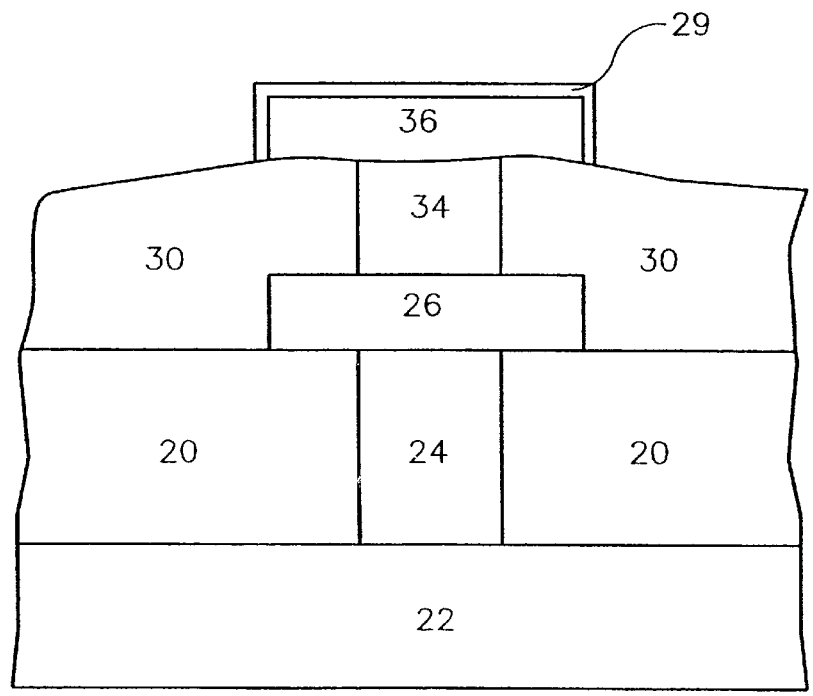
Figure 1K:
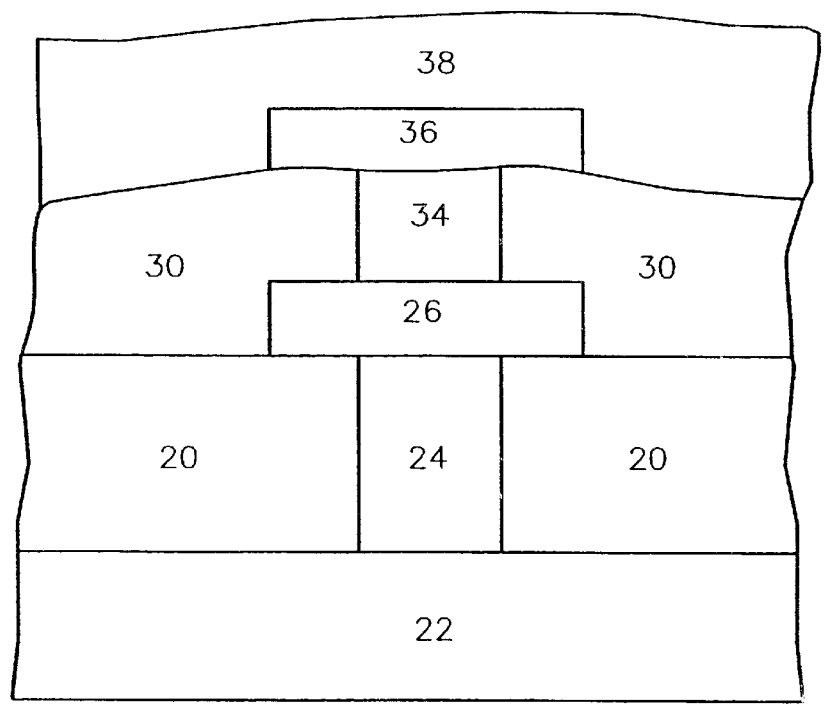

After the oxygen ash step, residue 29, such as organic components from the photoresist 28, often remain on the second metal layer 36, as illustrated in FIG. 1J. The longer the second metal layer 36 is exposed to the photoresist 28 during the etch process, the harder it becomes to effectively remove all of the residue 29 from the surface of the second metal layer 36. This is due to the fact that the organic materials become metallized, as described previously. Thus, the structure illustrated in FIG. 1J is exposed to the cleaning composition of this invention after the oxygen ash step. The exposure time needed for effectively cleaning the metallized organic residue 29 varies. The exposure time must be adjusted to allow for adequate cleaning without removing excess metal from underlying surfaces. As one example, an exposure time of about one minute seems to provide an adequate balance between these two competing factors, when using concentrations of each acidic component of less than about 5% by volume and temperatures of about 30 to about 45 degrees Celsius.

If the multilevel interconnect structure includes more than two levels of metal, subsequent insulating layers, vias, and metal layers are formed thereon, as described previously and represented generally as 38 in FIG. 1K. The intermediate structures are cleaned in the phosphoric acid/acetic acid composition of the present invention, as described previously. However, not every surface clean must be performed with the cleaning composition of the present invention, but it is advantageous to do so for achieving optimum electrical performance. The present cleaning composition may be used for one or more of the cleans when forming a multilevel interconnect structure.

The chemical composition of the present invention effectively removes metallized organic residue from metal surfaces, without deleteriously removing too much of the metal surface. By removing such residue, resulting resistivity of an IC is lowered. This is critical for the continued increase in device density, enabling fabrication of faster ICs with lower power consumption. Furthermore, due to the absence of strong organic solvents in the chemical composition, use of the cleaner is even more desirable because it doesn't require special hazardous waste disposal procedures.

It is to be understood that the above description is intended to be illustrative, and not restrictive. Many other embodiments will be apparent to those of skill in the art upon reviewing the above description. For example, the chemical cleaning composition of this invention is particularly useful wherever a metal surface needs to be cleaned during the fabrication process. The scope of the invention should, therefore, be determined with reference to the appended claims, along with the full scope of equivalents to which such claims are entitled.

What is claimed is:

1. A cleaning composition for use in semiconductor integrated circuit fabrication, the cleaning composition consisting of a dilute aqueous cleaning solution of phosphoric acid and acetic acid, wherein a concentration of the phosphoric acid and acetic acid is about 20% or less by volume, the cleaning composition adapted to remove metallized organic residue from a surface.

2. A cleaning composition for use in semiconductor integrated circuit fabrication, consisting of a dilute aqueous cleaning solution including phosphoric acid at a concentration of less than about 10% by volume and acetic acid at a concentration of less than about 10% by volume, the cleaning composition adapted to remove metallized organic residue from a surface.

3. The cleaning composition of claim 2, wherein the phosphoric acid is of a concentration of about 5% by volume or less and the acetic acid is of a concentration of about 5% by volume or less.

4. The cleaning composition of claim 2, wherein the cleaning composition has a temperature of less than about 50 degrees Celsius.

5. The cleaning composition of claim 4, wherein the cleaning composition has a temperature of about 30 to about 45 degrees Celsius.

* * * * *